(12) United States Patent
Lee et al.

(10) Patent No.: US 7,310,014 B2
(45) Date of Patent: Dec. 18, 2007

(54) INTERNAL VOLTAGE GENERATOR

(75) Inventors: Kang-Seol Lee, Ichon-shi (KR);
Jae-Hyuk Im, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/302,376

(22) Filed: Dec. 14, 2005

(65) Prior Publication Data

US 2006/0244516 A1 Nov. 2, 2006

(30) Foreign Application Priority Data

Apr. 29, 2005 (KR) ................ 10-2005-0036267

(51) Int. Cl.
*G05F 1/10* (2006.01)
(52) U.S. Cl. ..................................... 327/536
(58) Field of Classification Search ............... 327/535, 327/536, 537
See application file for complete search history.

(56) References Cited

U.S. PATENT DOCUMENTS

| | | | |
|---|---|---|---|
| 5,282,170 A | | 1/1994 | Van Buskirk et al. |
| 5,444,362 A | * | 8/1995 | Chung et al. ............... 323/313 |
| 5,677,645 A | * | 10/1997 | Merritt ....................... 327/536 |
| 5,939,935 A | * | 8/1999 | Merritt ....................... 327/536 |
| 6,097,428 A | | 8/2000 | Wu et al. |
| 6,150,860 A | | 11/2000 | Chun |
| 6,297,624 B1 | | 10/2001 | Mitsui et al. |
| 6,333,873 B1 | | 12/2001 | Kumanoya et al. |
| 6,366,482 B1 | * | 4/2002 | Jeong .......................... 363/60 |
| 6,507,237 B2 | * | 1/2003 | Hsu et al. .................... 327/538 |
| 6,646,493 B2 | * | 11/2003 | Butler ........................ 327/536 |
| 6,833,752 B2 | * | 12/2004 | Merritt et al. .............. 327/536 |
| 6,861,872 B2 | | 3/2005 | Suh |
| 6,952,129 B2 | * | 10/2005 | Lin et al. .................... 327/536 |
| 2004/0232957 A1 | | 11/2004 | Do |

FOREIGN PATENT DOCUMENTS

| | | |
|---|---|---|
| JP | 10-125097 | 5/1998 |
| KR | 1020020084892 | 11/2002 |

* cited by examiner

*Primary Examiner*—Jeffrey Zweizig
(74) *Attorney, Agent, or Firm*—McDermott Will & Emery LLP (57) ABSTRACT

An internal voltage generator for stably generating an internal voltage includes a latch unit for outputting a first and a second driving signals based on a periodic signal; a first pump block for generating the internal voltage in response to the first driving signal; and a second pump block for generating the internal voltage in response to the second driving signal.

13 Claims, 9 Drawing Sheets

INTERNAL VOLTAGE GENERATOR

FIELD OF THE INVENTION

The present invention relates to an internal voltage generator; and, more particularly, to an internal voltage generator for stably maintaining an internal voltage level having a short response time.

DESCRIPTION OF RELATED ARTS

Generally, an internal voltage generator included in a semiconductor memory device generates various voltages used in the semiconductor memory device by using an external power supply voltage. Recently, the internal voltage generator is widely used in a dynamic random access memory (DRAM) as an operational voltage and a power consumption of the DRAM are decreased.

Meanwhile, since the internal voltage is internally generated, it is important to stably generate the internal voltage regardless of variations of process, temperature or pressure.

Figure 1:
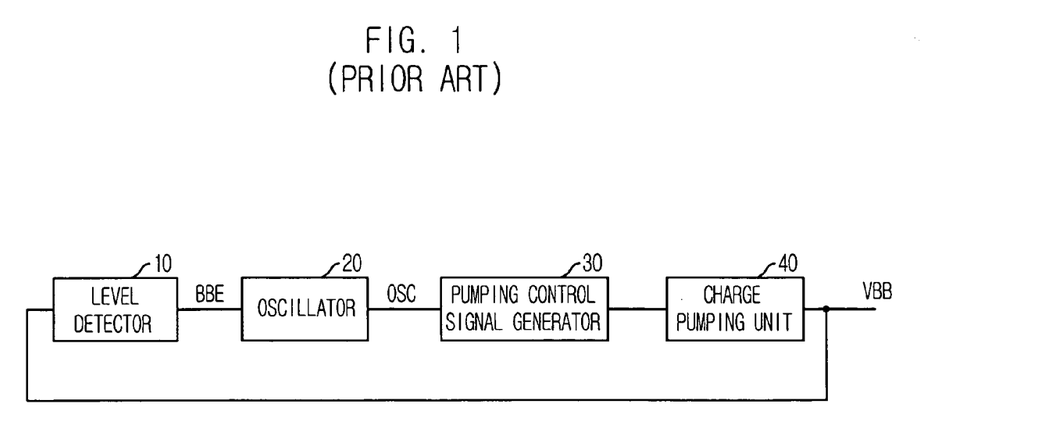
FIG. 1 is a block diagram showing a conventional internal voltage generator.

FIG. 1 is a block diagram showing a conventional internal voltage generator.

As shown, the conventional internal voltage generator includes a charge pumping unit 40 for generating an internal voltage VBB by performing a negative pumping operation to an external power supply voltage VDD; a level detector 10 for detecting a voltage level of the internal voltage VBB to thereby generate a detection signal BBE; an oscillator 20 for generating a periodic signal OSC in response to the detection signal BBE; and a pumping control signal generator 30 for controlling an operation of the charge pumping unit 40 according to the periodic signal OSC. Herein, a voltage level of the internal voltage VBB is lower than that of the external power supply voltage VDD.

When the voltage level of the internal voltage VBB is higher than a predetermined voltage level, the level detector 10 operates the charge pumping unit 40 through the oscillator 20 and the pumping control signal generation unit 30 in order to decrease the voltage level of the internal voltage VBB to the predetermined voltage level. In this manner, the internal voltage VBB can have a constant voltage level.

Meanwhile, the charge pumping unit 40 can be embodied with a doubler-typed charge pump.

Figure 2:
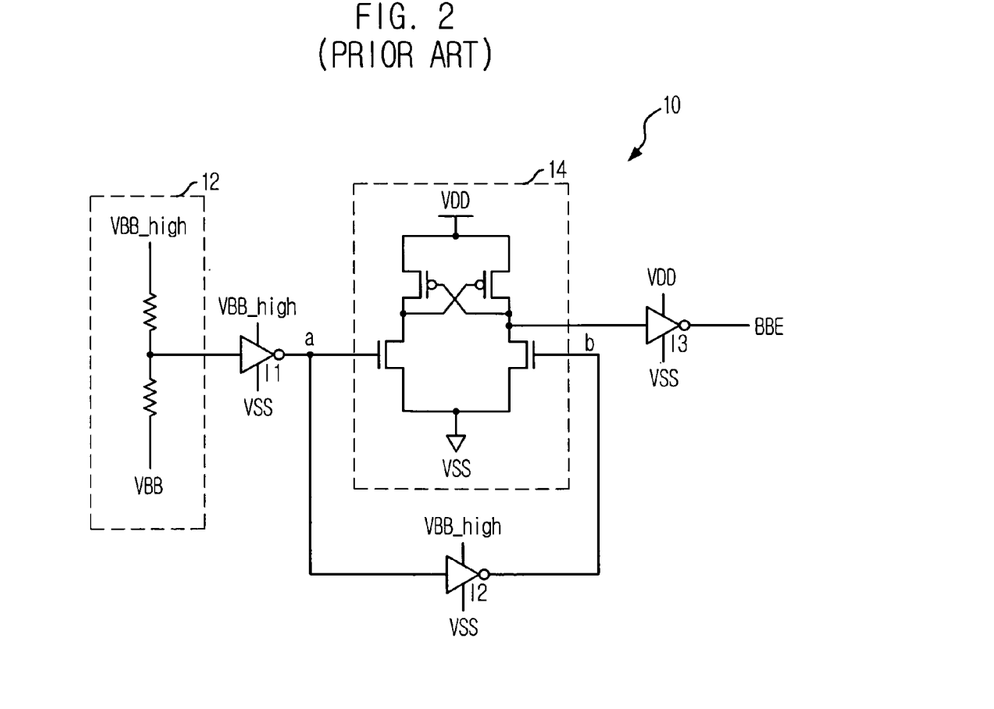
FIG. 2 is a schematic circuit diagram depicting a level detector shown in FIG. 1.

FIG. 2 is a schematic circuit diagram depicting the level detector 10 shown in FIG. 1.

As shown, the level detector 10 includes a voltage divider 12, a first inverter I1, a second inverter I2, a differential amplifier 14 and a third inverter I3.

The voltage divider 12 includes a plurality of resistors for dividing a voltage difference between a reference voltage VBB_high and the internal voltage VBB. The first inverter I1 receives the reference voltage VBB_high and a power supply voltage VSS as a driving voltage and inverts an output of the voltage divider 12. The second inverter I2 receives the reference voltage VBB_high and the power supply voltage VSS as a driving voltage in order to generate a second output voltage B by inverting a first output voltage A generated by the first inverter I1. Herein, the power supply voltage VSS is a ground voltage.

The differential amplifier 14 amplifies a voltage difference between the first output voltage A and the second output voltage B. The third inverter I3 receives the reference voltage VBB_high and the power supply voltage VSS as a driving voltage in order to generate the detection signal BBE by inverting an output of the differential amplifier 14.

When the voltage level of the internal voltage VBB is higher than that of the reference voltage VBB_high, the first output voltage A has a voltage level of the power supply voltage VSS and the second output voltage B has a voltage level of the reference voltage VBB_high. Therefore, the output of the differential amplifier 14 has a voltage level of the power supply voltage VSS. Accordingly, the detection signal BBE generated by the third inverter I3 is in a logic high level, i.e., has a voltage level of the external power supply voltage VDD.

On the contrary, when the voltage level of the internal voltage VBB is maintained as the voltage level of the reference voltage VBB_high, the first output voltage A has the voltage level of the reference voltage VBB_high and the second output voltage B has the voltage level of the power supply voltage VSS. Accordingly, the output of the differential amplifier 14 is in a logic high level and the detection signal BBE is in a logic low level.

Figure 3:
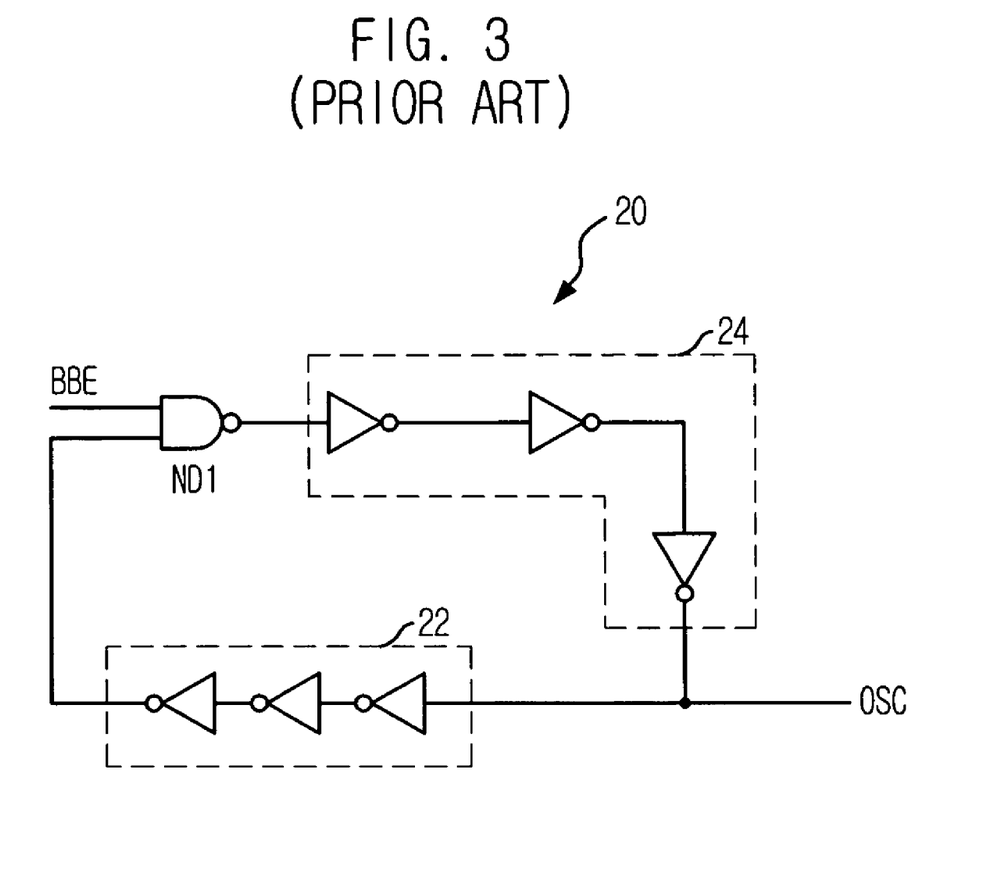
FIG. 3 is a schematic circuit diagram showing an oscillator shown in FIG. 1.

FIG. 3 is a schematic circuit diagram showing the oscillator 20 shown in FIG. 1.

As shown, the oscillator 20 includes a first inverter chain 22 for generating a feed-backed periodic signal by delaying and inverting the periodic signal OSC; a NAND gate ND1 for performing a logic NAND operation to the feed-backed period signal and the detection signal; and a second inverter chain 24 for generating the periodic signal OSC by delaying and inverting an output of the NAND gate ND1.

The oscillator 20 generates the periodic signal OSC according to the detection signal BBE. That is, when the detection signal BBE is in a logic high level, the oscillator 20 generates the periodic signal OSC so that the periodic signal OSC toggles having a predetermined period. On the contrary, when the detection signal BBE is in a logic low level, the periodic signal OSC is in a logic low level.

Figure 4A:
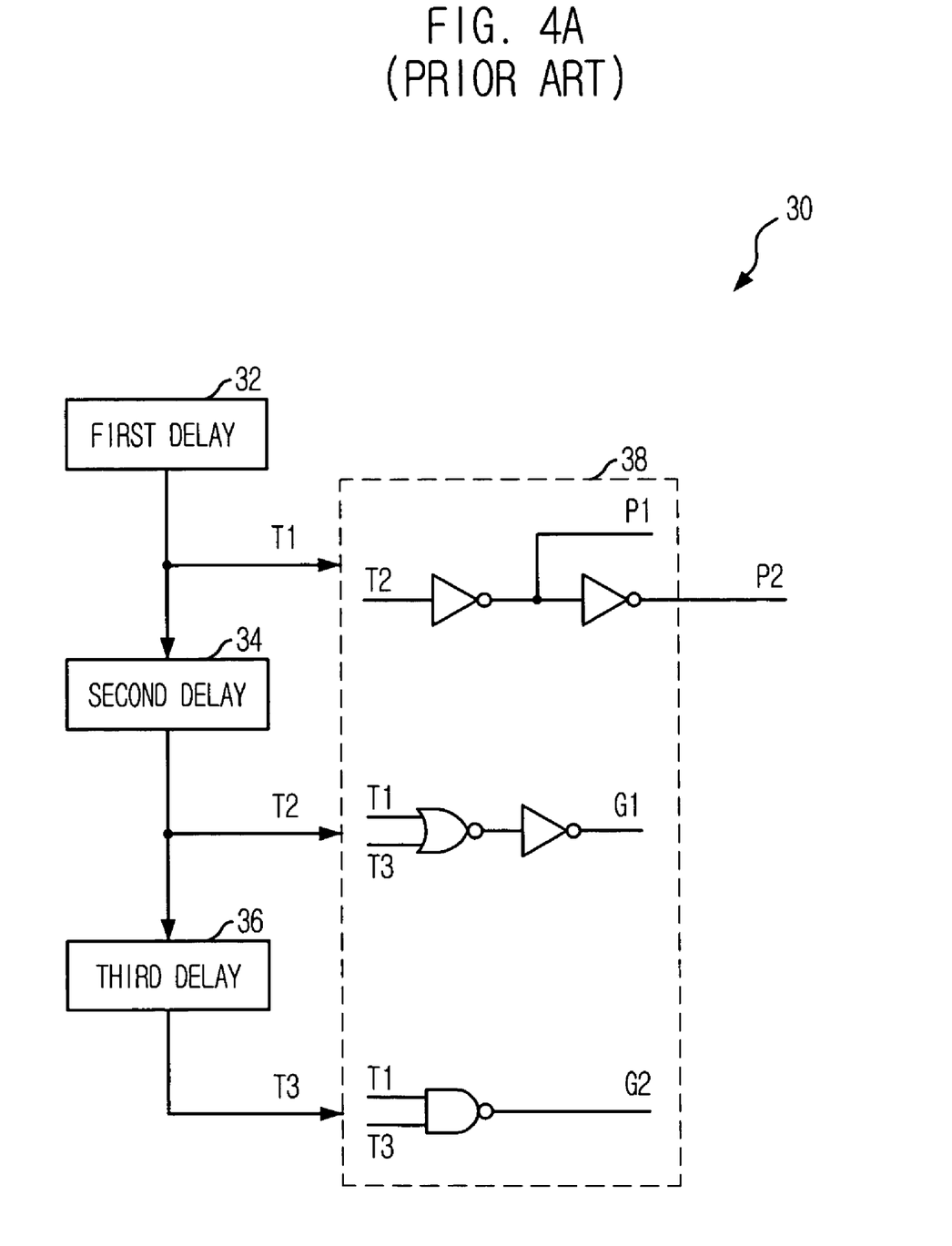
FIG. 4A is a schematic circuit diagram illustrating a pumping control signal generator shown in FIG. 1.

FIG. 4A is a schematic circuit diagram illustrating the pumping control signal generator 30 shown in FIG. 1.

As shown, the pumping control signal generator 30 includes a first to a third delay units 32 to 36 and a signal generation unit 38.

The first delay unit 32 delays the periodic signal OSC to thereby generate a first delayed-periodic signal T1. The second delay unit 34 delays the first delayed-periodic signal T1 to thereby generate a second delayed-periodic signal T2. Similarly, the third delay unit 36 delays the second delayed-periodic signal T2 to thereby generate a third delayed-periodic signal T3.

The signal generation unit 38 receives the first to the third delayed-periodic signals T1 to T3 in order to generate a plurality of pumping control signals, i.e., P1, P2, G1 and G2.

Figure 4B:
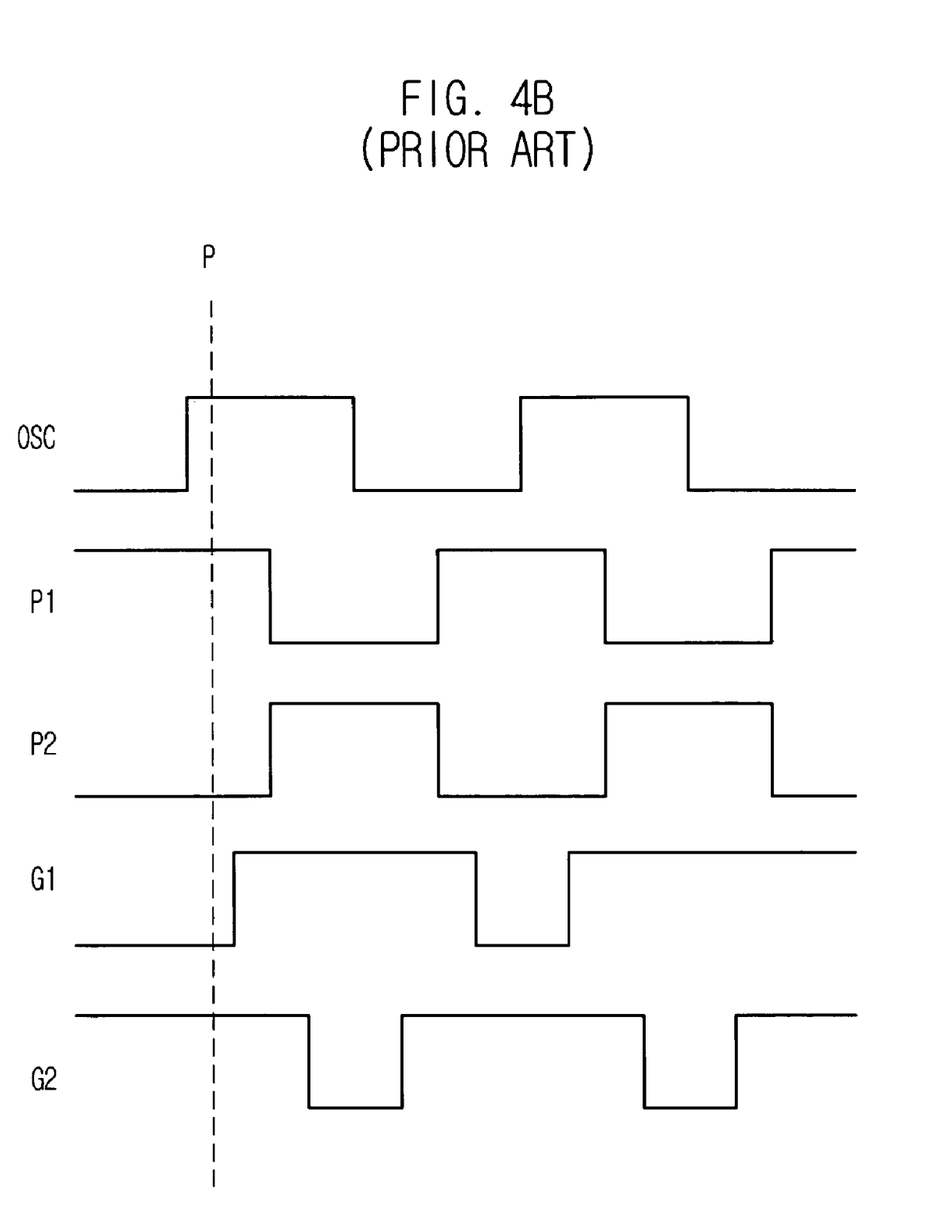
FIG. 4B is a wave diagram showing an operation of the pumping control signal generator shown in FIG. 4A.

FIG. 4B is a wave diagram showing an operation of the pumping control signal generator 30 shown in FIG. 4A.

As shown, the pumping control signal P2 is a delayed version of the periodic signal OSC and the pumping control signal P1 has an opposite phase in comparison with a phase of the pumping control signal P2. An activation period of the pumping control signal G1 includes an activation period of the pumping control signal P2 and there is a 90-degree phase difference between the pumping control signals G1 and G2.

Herein, it is assumed that the internal voltage VBB is higher than the reference voltage VBB_high, whereby the oscillator 20 generates the periodic signal OSC and the level detector 10 activates the detection signal BBE as a logic high level.

Figure 5:
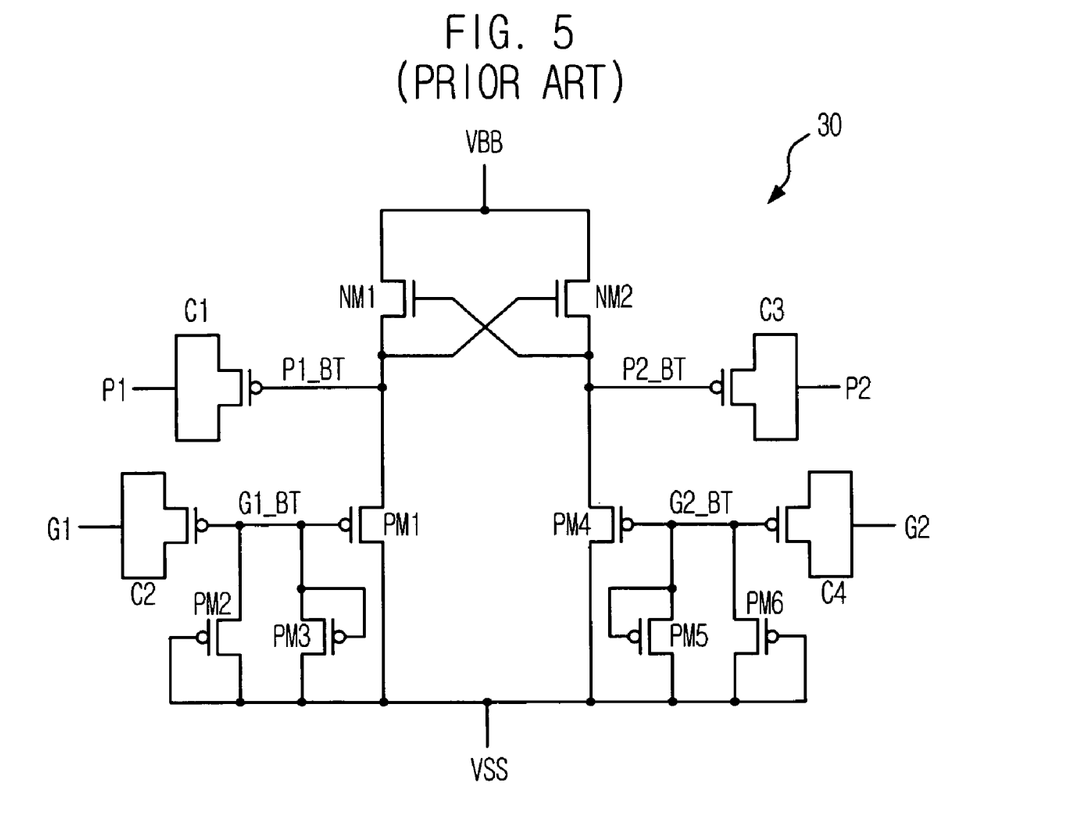
FIG. 5 is a schematic circuit diagram depicting a charge pumping unit shown in FIG. 1.

FIG. 5 is a schematic circuit diagram depicting the charge pumping unit 40 shown in FIG. 1.

As shown, the charge pumping unit 40 includes a first to a fourth capacitors C1 to C4, a first and a second n-type metal oxide semiconductor (NMOS) transistors NM1 and NM2, and a first to a sixth p-type metal oxide semiconductor (PMOS) transistors PM1 to PM6.

In detail, one terminal of the first capacitor C1 receives the pumping control signal P1 and the other terminal of the first capacitor C1 is coupled to a node P1_BT. Similarly, one terminal of the third capacitor C3 receives the pumping control signal P2 and the other terminal of the third capacitor C3 is coupled to a node P2_BT. A drain-source path of the second NMOS transistor NM2 is connected between the internal voltage VBB and the node P2_BT and a gate of the second NMOS transistor NM2 is coupled to the node P1_BT. Similarly, a drain-source path of the first NMOS transistor NM1 is connected between the internal voltage VBB and the node P1_BT and a gate of the first NMOS transistor NM1 is coupled to the node P2_BT.

One terminal of the second capacitor C2 receives the pumping control signal G1 and the other terminal of the second capacitor C2 is connected to a node G1_BT. Similarly, one terminal of the fourth capacitor C4 receives the pumping control signal G2 and the other terminal of the fourth capacitor C4 is coupled to a node G2_BT.

A source-drain path of the first PMOS transistor PM1 is connected between the node P1_BT and the power supply voltage VSS and a gate of the first PMOS transistor PM1 is coupled to the node G1_BT. A source-drain path of the fourth PMOS transistor PM4 is connected between the node P2_BT and the power supply voltage VSS and a gate of the fourth PMOS transistor PM4 is coupled to the node G2_BT.

A source of the second PMOS transistor PM2 is coupled to the node G1_BT and a drain and a gate of the second PMOS transistor PM2 are coupled to a drain of the first PMOS transistor PM1. A source and a gate of the third PMOS transistor PM3 are coupled to the node G1_BT and a drain of the third PMOS transistor PM3 is connected to the drain of the first PMOS transistor PM1. A source of the sixth PMOS transistor PM6 is coupled to the node G2_BT and a gate and a drain of the sixth PMOS transistor PM6 are coupled to a drain of the fourth PMOS transistor PM4. A source and a gate of the fifth PMOS transistor PM5 are coupled to the node G2_BT and a drain of the fifth PMOS transistor PM5 is connected to the drain of the fourth PMOS transistor PM4.

Referring to FIGS. 4B and 5, an operation of the charge pumping unit 40 is described below. Herein, it is assumed that a point of time is 'P'.

As shown in FIG. 4B, the pumping control signal P1 is in a logic high level, the pumping control signal G1 is in a logic low level and the pumping control signal G2 is in a logic high level. Therefore, according to the pumping control signal G1, the node G1_BT has a voltage level of the power supply voltage VSS. Accordingly, the first PMOS transistor PM1 is turned on and, thus, the node P1_BT has a voltage level of the power supply voltage VSS.

Meanwhile, according to the pumping control signal G2, the node G2_BT has a voltage level of the external power supply voltage VDD. Thereafter, the pumping control signal G1 transits to a logic high level and the node G1_BT is increased to a voltage level of the external power supply voltage VDD. Accordingly, the first PMOS transistor PM1 is turned off and, thus, the node P1_BT is disconnected from the power supply voltage VSS.

Thereafter, the pumping control signal P1 transits to a logic low level and, thus, the node P1_BT has a voltage level of −VDD due to the first capacitor C1. Similarly, since the pumping control signal P2 transits to a logic high level, the node P2_BT has a voltage level of the external power supply voltage VDD due to the third capacitor C3.

Therefore, since a gate of the first NMOS transistor NM1 is coupled to the node P2_BT, the first NMOS transistor NM1 is turned on so that the voltage of −VDD loaded on the node P2_BT is outputted as the internal voltage VBB.

Thereafter, a logic level of the pumping control signal G2 is changed to a logic low level and, thus, the node P2_BT is precharged to a voltage level of the power supply voltage VSS by the fourth PMOS transistor PM4. Then, the pumping control signal G2 transits to a logic high level. Therefore, the fourth PMOS transistor PM4 is turned off and the node P2_BT is disconnected from the power supply voltage VSS.

Thereafter, the pumping control signal P1 transits to a logic high level and, thus, a voltage loaded on the node P1_BT is increased to a voltage level of the external power supply voltage VDD. Meanwhile, a voltage loaded on node P2_BT is decreased to a voltage level of −VDD as the pumping control signal P2 transits to a logic low level.

Accordingly, since the second NMOS transistor NM2 is turned on, a voltage level of −VDD loaded on the node P2_BT is outputted as the internal voltage VBB.

Recently, a voltage level of an external power supply voltage is continuously decreased and it is required that an internal voltage has a lower voltage level than −VDD. However, the conventional internal voltage generator cannot generate an internal voltage whose voltage level is lower than −VDD.

In addition, as the pumping operation is performed, each voltage level loaded on the nodes P1_BT and P2_BT is decreased. Accordingly, a pumped voltage cannot be efficiently outputted as the internal voltage.

SUMMARY OF THE INVENTION

It is, therefore, an object of the present invention to provide an internal voltage generator for generating an internal voltage having a lower voltage level.

In accordance with an aspect of the present invention, there is provided an internal voltage generator including: a latch unit for outputting a first and a second driving signals based on a periodic signal; a first pump block for generating the internal voltage in response to the first driving signal; and a second pump block for generating the internal voltage in response to the second driving signal.

In accordance with another aspect of the present invention, there is provided an internal voltage generator, including: a charge pumping unit, the charge pumping unit including a first charging unit for charging a first node and a second node to a different voltage level in response to an activation of a first pumping control signal; a first pumping unit for performing a pumping operation to the first node in response to a second pumping control signal activated when the first pumping control signal is inactivated; a second charging unit for charging a third node and a fourth node to a different voltage level in response to an activation of a third pumping control signal; and a second pumping unit for performing a pumping operation to the fourth node in response to a voltage loaded on the second node, wherein a voltage loaded on the third node is outputted as an output control signal and a voltage loaded on the fourth node is outputted as an internal voltage whose voltage level is negative; and a driving control unit for generating the first to the third pumping control signals in response to a driving signal, wherein the first and the second pumping control signals have same phase and a phase of the third pumping control signal is opposite to a phase of the first pumping control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an internal voltage generator in accordance with the present invention will be described in detail referring to the accompanying drawings.

Figure 6:
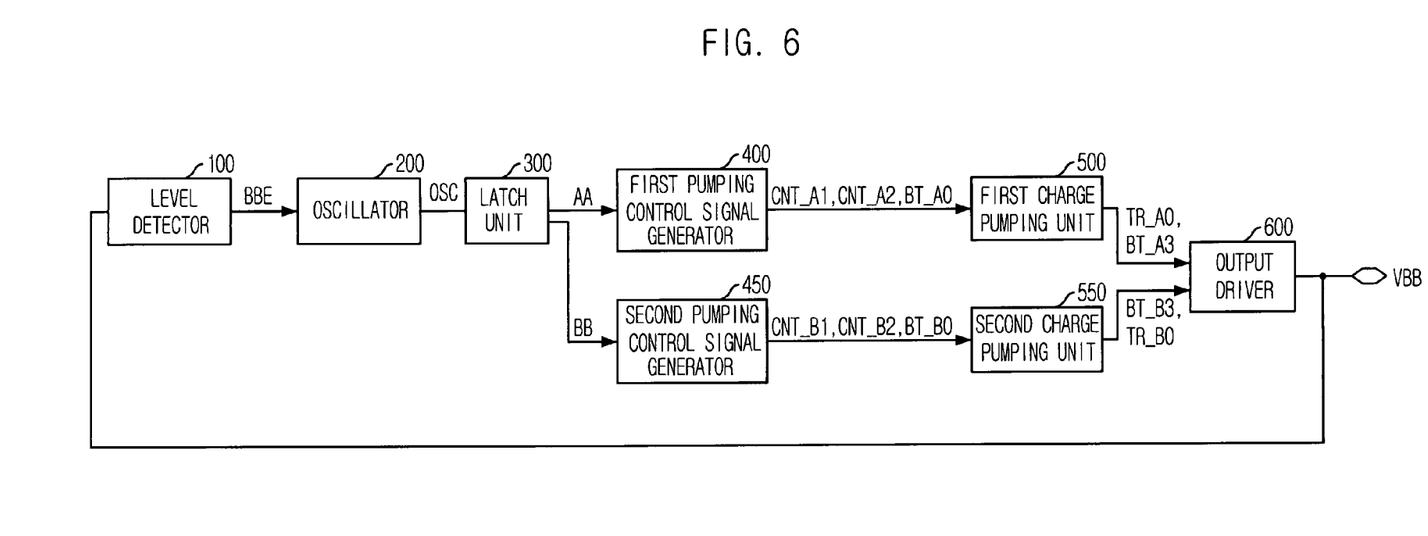
FIG. 6 is a block diagram showing an internal voltage generator in accordance with a preferred embodiment of the present invention.

FIG. 6 is a block diagram showing an internal voltage generator in accordance with a preferred embodiment of the present invention.

As shown, the internal voltage generator includes a level detector 100, an oscillator 200, a latch unit 300, a first pumping control signal generator 400, a second pumping control signal generator 450, a first charge pumping unit 500, a second charge pumping unit 550 and an output driver 600.

The first and the second charge pumping units 500 and 550 perform a negative charge pumping operation to an external power supply voltage VDD in order to generate a voltage whose voltage level is lower than that of the external power supply voltage VDD. An output voltage of the first charge pumping unit 500 and an output voltage of the second charge pumping unit 550 are outputted as an internal voltage VBB by turns by the output driver 600 according to an output control signal.

The level detector 100 detects a voltage level of the internal voltage VBB to thereby generate a detection signal BBE. The oscillator 200 generates a periodic signal OSC in response to the detection signal BBE. The latch unit 300 receives the detection signal BBE in order to generate a first driving signal AA and a second driving signal BB. Herein, the first and the second driving signals AA and BB have opposite phase.

The first pumping control signal generator 400 generates a first to a third pumping control signals, i.e., CNT_A1, CNT_A2 and BT_A0, in response to the first driving signal AA. The second pumping control signal generator 450 generates a fourth to a sixth pumping control signals, i.e., CNT_B1, CNT_B2 and BT_B0, in response to the second driving signal BB.

Since the first and the second driving signals AA and BB have opposite phase, an operation period of the first charge pumping unit 500 does not overlap with an operation period of the second charge pumping unit 550.

Meanwhile, the level detector 100, the oscillator 200, the latch unit 300, the first pumping control signal generator 400 and the second pumping control signal generator 450 constitute a driving control block for driving the first and the second charge pumping units 500 and 550 based on a voltage level of the external power supply voltage VDD.

Figure 7:
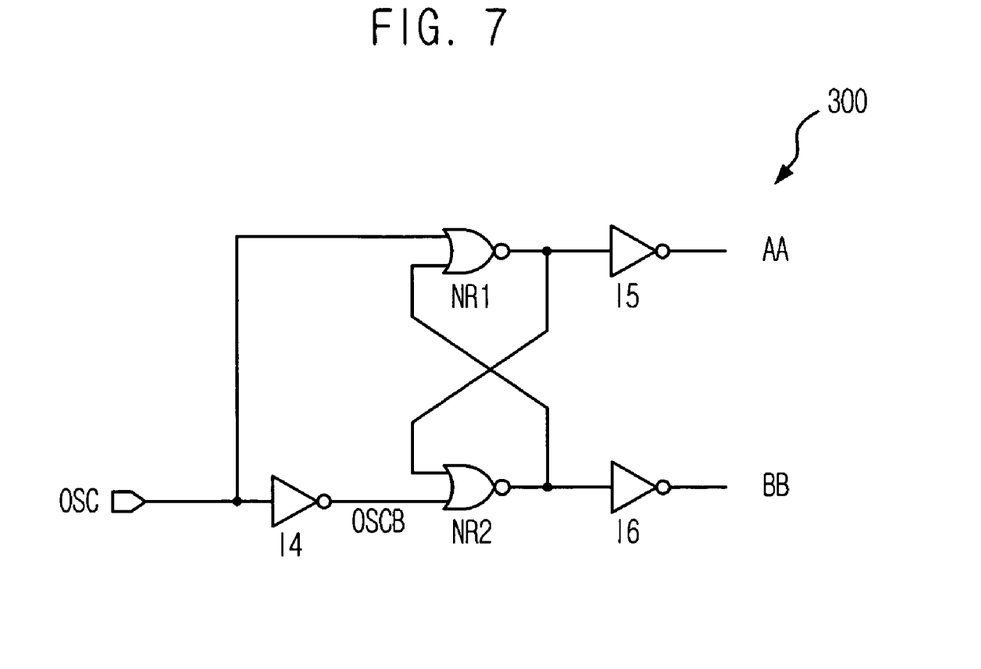
FIG. 7 is a schematic circuit diagram depicting a latch unit shown in FIG. 6.

FIG. 7 is a schematic circuit diagram depicting the latch unit 300 shown in FIG. 6.

As shown, the latch unit 300 includes a first inverter 14 for generating an inverted periodic signal OSCB by inverting the periodic signal OSC; a first NOR gate NR1 and a second NOR gate NR2 cross-coupled for respectively receiving the periodic signal OSC and the inverted periodic signal OSCB; a second inverter 15 for generating the first driving signal AA by inverting an output of the first NOR gate NR1; and a third inverter 16 for generating the second driving signal BB by inverting an output of the second NOR gate NR2.

When the periodic signal OSC is in a logic high level, the first and the second driving signals AA and BB are in a logic high level and a logic low level respectively. On the contrary, when the period signal OSC is in a logic low level, the first and the second driving signals AA and BB are in a logic low level and a logic high level respectively. Herein, since the first and the second driving signals AA and BB are generate by the cross-coupled NOR gates, i.e., the first and the second NOR gates NR1 and NR2, the first and the second driving signals AA and BB have 180-degree phase difference regardless of variations due to a manufacturing process.

Figure 8:
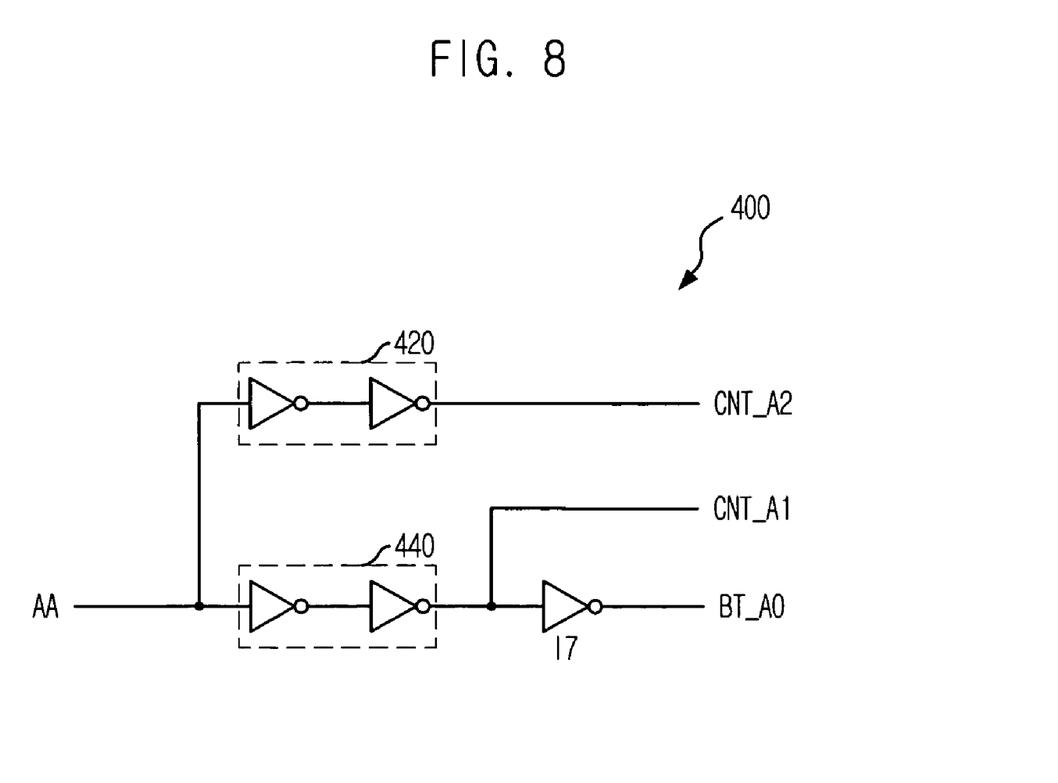
FIG. 8 is a schematic circuit diagram showing a first pumping control signal generator shown in FIG. 6.

FIG. 8 is a schematic circuit diagram showing the first pumping control signal generator 400 shown in FIG. 6.

As shown, the first pumping control signal generator 400 includes a first buffer 420 for generating the second pumping control signal CNT_A2 by buffering the first driving signal AA; a second buffer 440 for generating the first pumping control signal CNT_A1 by buffering the first driving signal AA; and a fourth inverter 17 for generating the third pumping control signal BT_A0 by inverting an output of the second buffer 440.

When the first driving signal AA is in a logic high level, the first pumping control signal generator 400 outputs the first and the second pumping control signals CNT_A1 and CNT_A2 as a logic high level and outputs the third pumping control signal BT_A0 as a logic low level. On the other hand, when the first driving signal AA is in a logic low level, the first and the second pumping control signals CNT_A1 and CNT_A2 are in a logic low level and the third pumping control signal BT_A0 is in a logic high level.

Herein, since a structure and an operation of the second pumping control signal generator 450 are same to those of the first pumping control signal generator 400, detailed descriptions of the second pumping control signal generator 450 are omitted.

Figure 9:
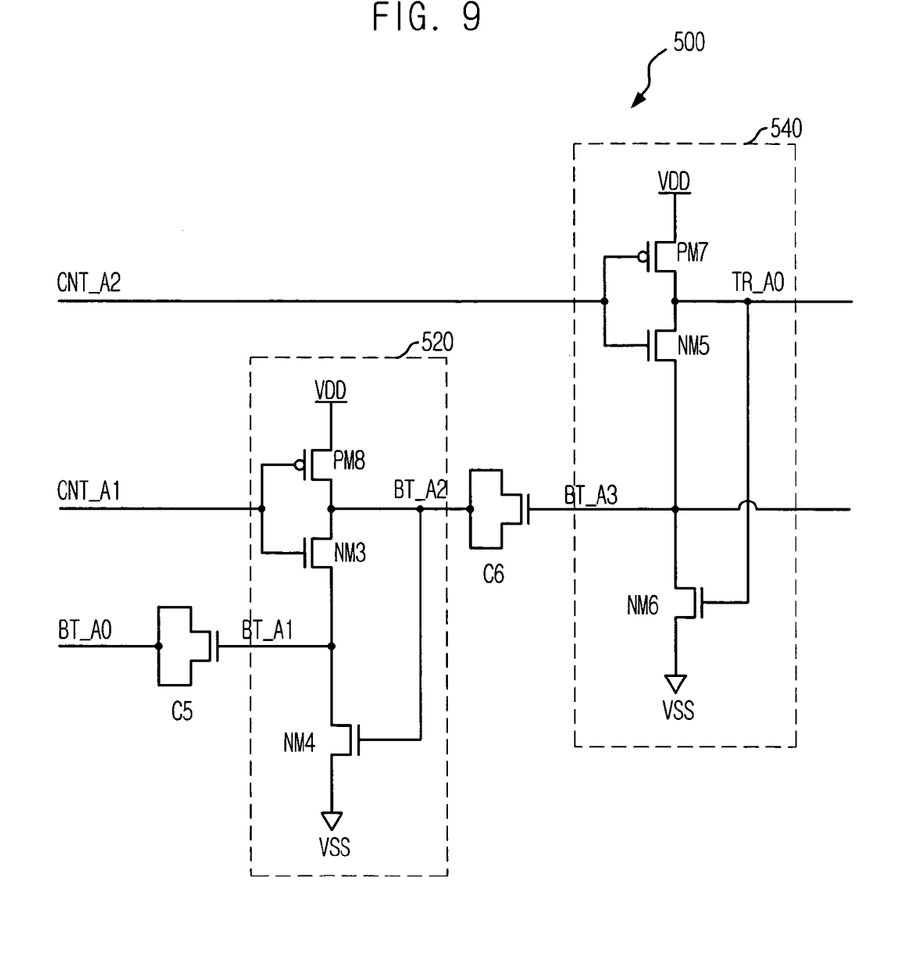
FIG. 9 is a schematic circuit diagram showing a first charge pumping unit shown in FIG. 6.

FIG. 9 is a schematic circuit diagram showing the first charge pumping unit 500 shown in FIG. 6.

As shown, the first charge pumping unit 500 includes a first charging unit 520 for charging a first node BT_A1 and a second node BT_A2 in response to an activation of the first pumping control signal CNT_A1 so that the first and the second nodes BT_A1 and BT_A2 have a different voltage level; a first pumping unit C5 for performing a pumping operation to the first node BT_A1 in response to the third pumping control signal BT_A0 activated when the first pumping control signal CNT_A1 is inactivated; a second charging unit 540 for charge a third node BT_A3 and a fourth node TR_A0 in response to an activation of the second pumping control signal CNT_A2 so that the third and the fourth nodes BT_A3 and TR_A0 have a different voltage level; and a second pumping unit C6 for performing a pumping operation to the third node BT_A3 in response to a voltage loaded on the second node BT_A2. The first charge pumping unit 500 outputs a voltage loaded on the fourth node TR_A0 as an output control signal and outputs a voltage loaded on the third node BT_A3 as an output voltage.

In detail, the first charging unit 520 includes a first n-type metal oxide semiconductor (NMOS) transistor NM3, a second NMOS transistor NM4 and a second p-type metal oxide semiconductor (PMOS) transistor PM8.

A source-drain path of the second PMOS transistor PM8 is connected between the external power supply voltage VDD and the second node BT_A2 and a gate of the second PMOS transistor PM8 receives the first pumping control signal CNT_A1. A drain-source path of the first NMOS transistor NM3 is connected between the second node BT_A2 and the first node BT_A1 and a gate of the first NMOS transistor NM3 receives the first pumping control signal CNT_A1. A drain-source path of the second NMOS transistor NM4 is connected between the first node BT_A1 and a power supply voltage VSS and a gate of the second NMOS transistor NM4 is coupled to the second node BT_A2.

The second charging unit 540 includes a third NMOS transistor NM5, a fourth NMOS transistor NM6 and a first PMOS transistor PM7.

A sour-drain path of the first PMOS transistor PM7 is connected between the power supply voltage VDD and the fourth node TR_A0 and a gate of the first PMOS transistor PM7 receives the second pumping control signal CNT_A2. A drain-source path of the third NMOS transistor NM5 is connected between the fourth node TR_A0 and the third node BT_A3 and a gate of the third NMOS transistor NM5 receives the second pumping control signal CNT_A2. A drain-source path of the fourth NMOS transistor NM6 is connected between the third node BT_A3 and the power supply voltage VSS and a gate of the fourth NMOS transistor NM6 is coupled to the fourth node TR_A0.

The first pumping unit C5 includes a capacitor whose one terminal and the other terminal are respectively coupled to the third pumping control signal BT_A0 and the first node BT_A1. Similarly, the second pumping unit C6 includes a capacitor connected between the second node BT_A2 and the third node BT_A3.

Figure 10:
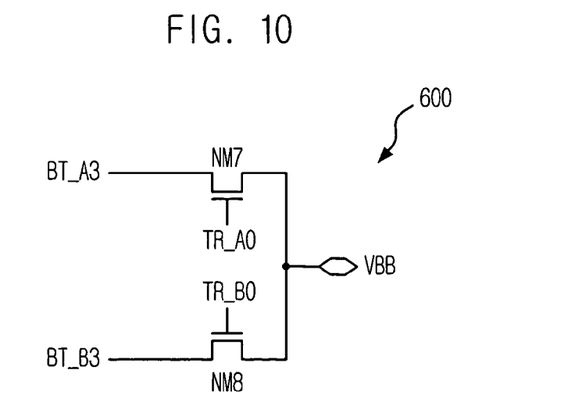
FIG. 10 is a schematic circuit diagram showing an output driver shown in FIG. 6.

FIG. 10 is a schematic circuit diagram showing the output driver 600 shown in FIG. 6.

As shown, the output driver 600 includes a fifth NMOS transistor NM7 for outputting an output voltage BT_A3 of the first charge pumping unit 500 as the internal voltage VBB in response to an output control signal TR_B0 of the second charge pumping unit 550; and a sixth NMOS transistor NM8 for outputting an output voltage BT_B3 of the second charge pumping unit 550 as the internal voltage VBB in response to an output control signal TR_A0 of the first charge pumping unit 500.

Figure 11:
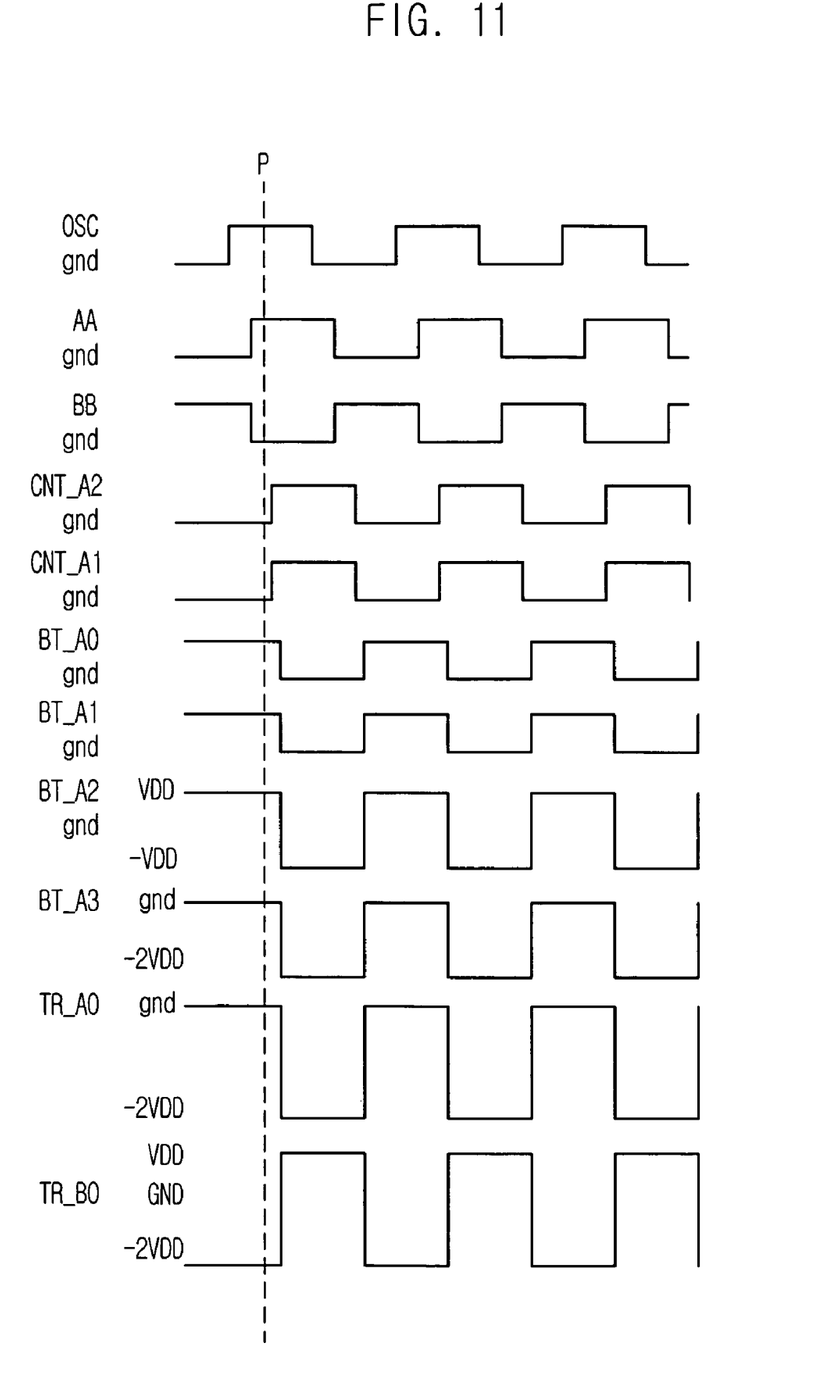
FIG. 11 is a wave diagram showing an operation of the internal voltage generator shown in FIG. 6.

FIG. 11 is a wave diagram showing an operation of the internal voltage generator shown in FIG. 6.

Referring to FIGS. 6 to 11, the operation of the internal voltage generator is described below.

Herein, it is assumed that the internal voltage VBB is higher than a reference voltage VREF_high so that the detection signal BBE is activated and the oscillator 200 constantly generates the periodic signal OSC. The description of the operation of the internal voltage generator begins at the timing 'P'.

In response to an activation of the periodic signal OSC, the latch unit 300 outputs the first driving signal AA and the second driving signal BB as a logic high level and a logic low level respectively. At this time, the first pumping control signal generator 400 outputs the first and the second pumping control signals CNT_A1 and CNT_A2 as a logic low level in response to the first driving signal AA.

Therefore, the second node BT_A2 and the fourth node TR_A0 are precharged to a voltage level of the external power supply voltage VDD by the second PMOS transistor PM8 and the first PMOS transistor PM7 respectively. Also, the first node BT_A1 and the third node BT_A3 are precharged to a voltage level of the power supply voltage VSS.

Thereafter, since the first and the second pumping control signals CNT_A1 and CNT_A2 transits to a logic high level, the first and the second PMOS transistors PM7 and PM8 are turned off and the first NMOS transistor NM3 and the third NMOS transistor NM5 are turned on. Therefore, the second node BT_A2 and the fourth node TR_A0 are disconnected from the external power supply voltage VDD. Also, since the second and the fourth NMOS transistors NM4 and NM6 are turned off due to voltages loaded on the second node BT_A2 and the fourth node TR_A0, the first and the third nodes BT_A1 and BT_A3 are disconnected from the power supply voltage VSS.

Meanwhile, since the third pumping control signal BT_A0 transits to a logic low level, the first node BT_A1 has a voltage level of −VDD and the second node BT_A2 also has a voltage level of −VDD due to the turned on first NMOS transistor NM3. Therefore, a voltage loaded on the third node BT_A3 is decreased to a voltage level of −2VDD due to a negative pumping operation performed by the second pumping unit C6 whose one terminal is coupled to the second node BT_A2. Also, the fourth node TR_A0 has a voltage level of −2VDD due to the turned on third NMOS transistor NM5.

Herein, although not shown, since the fourth to the sixth pumping control signals, i.e., CNT_B1, CNT_BT and BT_B0, have an opposite phase in comparison with the first to the third pumping control signals CNT_A1 to BT_A0, the output voltage BT_B3 and the output control signal TR_B0 generated by the second charge pumping unit 550 have a voltage level of the external power supply voltage VDD.

Therefore, the sixth NMOS transistor NM8 is turned off by the output control signal TR_A0 of the first charge pumping unit 500 and the fifth NMOS transistor NM7 is turned on by the output control signal TR_B0 of the second charge pumping unit 550. Since the fifth NMOS transistor NM7 is turned on, a voltage loaded on the third node BT_A3 of the first charge pumping unit 500 is outputted as the internal voltage VBB.

Meanwhile, at a next half period of the oscillator 200, the first charge pumping unit 500 does not perform a negative pumping operation. Accordingly, the output voltage BT_A3 and the output control signal TR_A0 have a voltage level of the external power supply voltage VDD, and the second charge pumping unit 550 outputs the output voltage BT_B3 and the output control signal TR_B0 as a voltage level of −2VDD by performing a negative pumping operation to the external power supply voltage VDD.

Then, the output driver 600 outputs a voltage loaded on a node BT_B3 of the second charge pumping unit 550 as the internal voltage VBB through the sixth NMOS transistor NM8 turned on by the output control signal TR_A0 generated by the first charge pumping unit 500.

As above-mentioned, since the driving control signals, i.e., AA and BB, are generated having 180-degree phase difference, it is prevented that driving periods of the first and the second charge pumping units are overlapped each other or no output is generated. Accordingly, an internal voltage can hold a stable voltage level.

Also, while the conventional internal voltage generator cannot generate an internal voltage lower than −VDD, the internal voltage generator in accordance with the present invention generates an internal voltage having a voltage level of −2VDD. Therefore, it is possible to generate a required internal voltage level even though a voltage level of an external power supply voltage is decreased.

Further, according to the conventional internal voltage generator, a voltage level required to turn on an output driver is increased as a pumping operation is performed. However, since the internal voltage generator generates not only an output voltage but also an output control signal by performing a pumping operation to an external power supply voltage, such a problem can be solved.

The present application contains subject matter related to Korean patent application No. 2005-36267, filed in the Korean Patent Office on Apr. 29, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for stably generating an internal voltage, comprising:
 a latch unit for outputting a first and a second driving signals based on a periodic signal;
 a first pump block for generating the internal voltage in response to the first driving signal; and
 a second pump block for generating the internal voltage in response to the second driving signal, wherein the first pump block includes a first charge pumping unit for performing a negative pumping operation to a power supply voltage to generate the internal voltage by performing two stages of charging and pumping based on a first to a third pumping control signals.

2. The internal voltage generator as recited in claim 1, wherein a level of the internal voltage is lower or equal to twice power supply voltage level than that of a ground voltage.

3. The internal voltage generator as recited in claim 2, further comprising:
 a level detection unit for detecting a voltage level of the internal voltage in order to generate a detection signal; and
 an oscillator for generating a periodic signal in response to the detection signal.

4. The internal voltage generator as recited in claim 3, further comprising an output driver for outputting one of outputs of the first and the second pump blocks as the internal voltage according to an output control signal of the first and the second pump blocks.

5. The internal voltage generator as recited in claim 4, wherein the first pump block includes:
 a first pumping control signal generation unit for generating a plurality of pumping control signals in response to the first driving signal.

6. The internal voltage generator as recited in claim 5, wherein the second pump block includes:
 a second pumping control signal generation unit for generating a plurality of pumping control signals in response to the second driving signal; and
 a second charge pumping unit for performing a negative pumping operation to a power supply voltage in order to generate the internal voltage.

7. The internal voltage generator as recited in claim 4, wherein the output driver includes:
 a first n-type metal oxide semiconductor (NMOS) transistor for outputting an output voltage of the second charge pumping unit as the internal voltage in response to an output control signal of the first charge pumping unit; and
 a second NMOS transistor for outputting an output voltage of the first charge pumping unit as the internal voltage in response to an output control signal of the second charge pumping unit.

8. The internal voltage generator as recited in claim 6, wherein the first charge pumping unit includes:
 a first charging unit for charging a first node and a second node to a different voltage level in response to an activation of the first pumping control signal;
 a first pumping unit for performing a pumping operation to the first node in response to the second pumping control signal;
 a second charging unit for charging a third node and a fourth node to a different voltage level in response to an activation of the third pumping control signal; and
 a second pumping unit for performing a pumping operation to the fourth node in response to a voltage loaded on the second node,
 wherein a voltage loaded on the third node is outputted as the output control signal and a voltage loaded on the fourth node is outputted as the output voltage.

9. The internal voltage generator as recited in claim 8, wherein the first charging unit includes:
 a first p-type metal oxide semiconductor (PMOS) transistor whose source-drain path is connected between the external power supply voltage and the second node, wherein a gate of the first PMOS transistor receives the first pumping control signal;
 a third NMOS transistor whose drain-source path is connected between the second node and the first node, wherein a gate of the third NMOS transistor receives the first pumping control signal; and
 a fourth NMOS transistor whose drain-source path is connected between the first node and a power supply voltage, wherein a gate of the fourth NMOS transistor is coupled to the second node.

10. The internal voltage generator as recited in claim 9, wherein the second charging unit includes:
 a second PMOS transistor whose source-drain path is connected between the external power supply voltage and the third node, wherein a gate of the second PMOS transistor receives the second pumping control signal;

a fifth NMOS transistor whose drain-source path is connected between the third node and the fourth node, wherein a gate of the fifth NMOS transistor receives the second pumping control signal; and a sixth NMOS transistor whose drain-source path is connected between the fourth node and the power supply voltage, wherein a gate of the sixth NMOS transistor is coupled to the third node.

11. The internal voltage generator as recited in claim 10, wherein the first pumping unit includes a first capacitor whose one terminal receives the second pumping control signal and the other terminal is coupled to the first node and the second pumping unit includes a second capacitor connected between the second node and the fourth node.

12. The internal voltage generator as recited in claim 11, wherein the first pumping control signal generation unit includes:

a first buffer for generating the third pumping control signal by buffering the first driving signal;

a second buffer for generating the first pumping control signal by buffering the first driving signal; and a first inverter for generating the second pumping control signal by inverting an output of the second buffer.

13. The internal voltage generator as recited in claim 12, wherein the latch unit includes:

a second inverter for inverting the periodic signal;

a first and a second NOR gates for respectively receiving an output of the second inverter and the periodic signal, wherein the first and the second NOR gates are cross-coupled each other;

a third inverter for inverting an output of the first NOR gate to thereby generate the first driving signal; and a fourth inverter for inverting an output of the second NOR gate to thereby generate the second driving signal.

* * * * *